(12) United States Patent
Araojo et al.

(10) Patent No.: US 11,506,699 B2
(45) Date of Patent: Nov. 22, 2022

(54) EMC TEST SYSTEM AND EMC TEST METHOD USING LIFI

(71) Applicant: Rohde & Schwarz GmbH & Co. KG, Munich (DE)

(72) Inventors: Erik Araojo, Singapore (SG); Anthony Magpantay, Singapore (SG)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 187 days.

(21) Appl. No.: 16/699,201

(22) Filed: Nov. 29, 2019

(65) Prior Publication Data

US 2021/0165031 A1    Jun. 3, 2021

(51) Int. Cl.
| | | |
|---|---|---|
| *H04B 10/00* | (2013.01) | |
| *G01R 31/00* | (2006.01) | |
| *H04B 10/116* | (2013.01) | |
| *G01R 31/28* | (2006.01) | |
| *H04B 10/50* | (2013.01) | |
| *H04B 10/43* | (2013.01) | |

(52) U.S. Cl.
CPC ....... *G01R 31/002* (2013.01); *G01R 31/2862* (2013.01); *H04B 10/116* (2013.01); *H04B 10/43* (2013.01); *H04B 10/502* (2013.01)

(58) Field of Classification Search
CPC .............. H04B 10/116; H04B 10/1143; H04B 10/1149; H04B 10/40; H04B 10/502; H04B 10/43; H04B 10/25753; G01R 31/002; G01R 31/2822; G01R 31/2862; G01R 31/3025
USPC ....... 398/172, 118, 119, 127, 128, 130, 158, 398/159, 135, 136, 115, 16, 22, 23, 24, 398/25, 26, 27, 33, 38, 9; 324/750.16, 324/750.27, 750.02, 537, 755, 765
See application file for complete search history.

(56) References Cited

U.S. PATENT DOCUMENTS

| | | | |
|---|---|---|---|
| 9,404,965 B2 * | 8/2016 | Nickel | G01R 31/3025 |
| 2013/0093447 A1 * | 4/2013 | Nickel | H04W 24/06 |
| | | | 324/750.16 |
| 2021/0194584 A1 * | 6/2021 | Rossius | H04B 10/25 |

* cited by examiner

*Primary Examiner* — Hanh Phan
(74) *Attorney, Agent, or Firm* — Ditthavong, Steiner & Mlotkowski

(57) ABSTRACT

An EMC test system (1) and an EMC test method performed in the EMC test system (1) for testing a DUT (6), wherein the EMC test system (1) comprises an EMC test chamber (2), wherein the DUT (6) is positioned in the EMC test chamber (2), at least one measurement equipment (4) positioned in the EMC test chamber (2) and communication means (3) using LiFi for transmitting and receiving measurement data and/or control data by the measurement equipment (4).

15 Claims, 1 Drawing Sheet

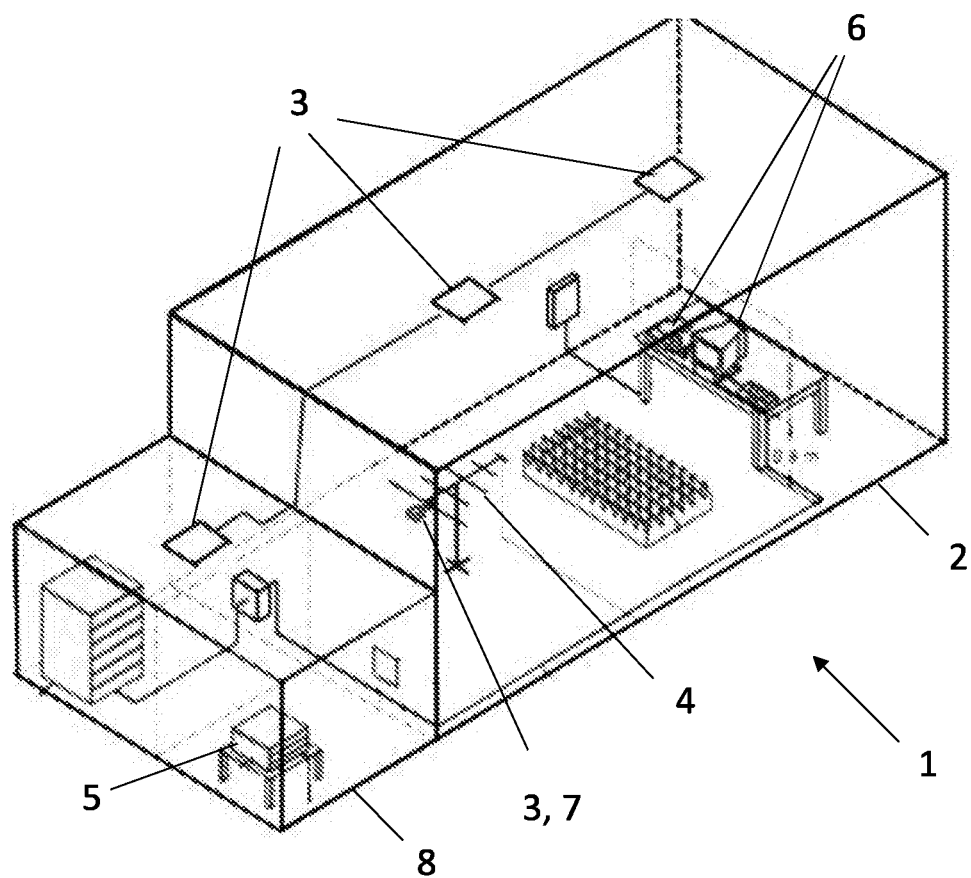

EMC TEST SYSTEM AND EMC TEST METHOD USING LIFI

FIELD OF THE INVENTION

The present invention relates to an electromagnetic compatibility (EMC) test system and an EMC test method performed in the EMC test system for testing a device under test (DUT). The EMC test system comprises an EMC test chamber, wherein the DUT is positioned in the EMC test chamber, at least one measurement equipment positioned in the EMC test chamber and communication means using light fidelity (LiFi) for transmitting and receiving measurement data and/or control data by the measurement equipment.

BACKGROUND

EMC is the ability of electrical or electronic devices/equipment and systems to operate in their electromagnetic environment without impairing their functions and without faults. This is reached by limiting the unintentional generation, propagation and reception of electromagnetic energy, which may cause unwanted effects such as electromagnetic inference (EMI). EMC ensures the correct operation in a common electromagnetic environment.

For the testing of electrical or electronic equipment and corresponding systems, EMC test systems are already known that comprise an EMC test chamber, for example an anechoic RF chamber, a reverberation chamber or gigahertz transverse electromagnetic (GTEM) cell.

In such an EMC test chamber the electronic equipment, respectively the DUT, is positioned. Further, for radiated emission measurement, antennas are used, wherein such an antenna can have for example specified designs like dipole, biconical, log-periodic, double ridged guide and conical log-spiral.

In addition, further measurement equipment is placed in such an EMC test chamber like for example specialized EMI test receivers or EMI analyzers. Further, there can be a measurement computer/device or the like, which evaluates and analyses measurement data/values received by different measurement equipment and further controls such equipment.

Presently, measurement equipment like antennas, EMI test receivers or EMI analyzers, and measurement computers/devices for evaluating, analyzing and controlling, are connected for example by radio frequency (RF) cables or fiber optic cables, in particular in the EMC test chamber. These specialized cables are necessary inside the EMC test chamber to avoid interferences caused by the cables.

However, these cables are expensive and fragile. For example RF cables connected to an antenna are possible sources for emissions when the cable is defective or due to wear and tear the shielding on the cable has been damaged. When using fiber optic cables extra care must be taken to ensure that the cables are not bend excessively and further, they should be laid out in a straight line.

In addition, when using RF cables it is necessary to periodically perform cable calibration to measure the cable loose. This is an additional effort and has to be done at least several times a year, maybe even daily or weekly.

It is therefore an object of the present invention to avoid interferences from cables inside an EMC test chamber and further to reduce the testing effort in an EMC test system comprising an EMC test chamber by avoiding cable calibration.

This object is achieved by means of the features of the independent claims. The dependent claims further develop the central idea of the present invention.

BRIEF SUMMARY OF THE INVENTION

The present invention relates to an EMC test system for testing a DUT. The EMC test system comprises an EMC test chamber, wherein the DUT is positioned in the EMC test chamber, at least one measurement equipment positioned in the EMC test chamber and communication means using LiFi for transmitting and receiving measurement data and/or control data by the measurement equipment.

LiFi is a wireless communication technology, which generally uses light to transmit data between devices. In more detail, LiFi is a light communication technique that is capable of transmitting data at high speeds over the visible light, ultraviolet and/or infrared spectrums. Using light to transmit data allows Li-Fi to offer the ability to safely function in areas where radio signals can be problematic due to EMC. That means that the communication with LiFi does not generate EMI and thus, does not disturb the measurement in the EMC test chamber.

In a preferred embodiment, the EMC test chamber is an anechoic chamber, a reverberation chamber or a GTEM cell.

Further, the at least one measurement equipment can be a measurement antenna, wherein the measurement antenna can be adapted to move vertically and/or to change polarization, in particular a 90° rotation.

Advantageously, the LiFi communication means comprise at least one transmitter, in particular a LED, and at least one receiver, in particular a photodiode or a photovoltaic cell. A receiver of the LiFi communication means can be positioned at or in the at least one measurement equipment and can be used for receiving control data for controlling the measurement equipment. Additionally, a transmitter of the LiFi communication means can be positioned at or in the at least one measurement equipment and can be used for transmitting measurement data obtained by the at least one measurement equipment.

In addition, it is possible that the measurement data obtained by the at least one measurement equipment are RF signals and the EMC test system further comprises a converter, in particular a shielded converter, in the EMC test chamber positioned between the at least one measurement equipment and the transmitter of the LiFi communication means for converting the RF signals into LiFi signals.

In a preferred embodiment, a receiver of the LiFi communication means is positioned at the DUT and is used for receiving control data for controlling the DUT.

Advantageously, at least one transmitter and/or at least one receiver of the LiFi communication means is positioned at a ceiling of the EMC test chamber.

The EMC test system can further comprise a measurement processing unit, in particular a computer or a tablet, for evaluating and/or analyzing measurement data and for controlling the at least one measurement equipment and/or the DUT.

The measurement processing unit can be positioned in the EMC test chamber and a transmitter and a receiver of the LiFi communication means can be positioned at the measurement processing unit and can be used for transmitting and receiving measurement data and control data. It would be also possible that the measurement processing unit is positioned outside the EMC test chamber and the measurement processing unit is connected with the at least one transmitter and/or at least one receiver of the LiFi communication means positioned at the celling of the EMC test chamber.

The present invention further relates to an EMC test method for testing a DUT performed in the above EMC test system, wherein the method comprises transmitting and receiving measurement data and/or control data using LiFi by the at least one measurement equipment.

In a preferred embodiment, the at least one measurement equipment obtains measurement data and transmits the obtained measurement data by using LiFi. Additionally, the at least one measurement equipment and/or the DUT can receive control data for controlling the at least one measurement equipment and/or the DUT by using LiFi.

The measurement data obtained by the at least one measurement equipment can be RF signals and the method can further comprise converting the RF signals into LiFi signals.

Further, it is possible that the measurement processing unit transmits and receives measurement data and control data by using LiFi.

By the EMC test system and the EMC test method of the present invention LiFi is used instead of RF cables or fiber optic cables inside an EMC test chamber to transmit and receive measurement data and control data. Therefore, possible interferences, for example EMI, generated by damaged cables are avoided and no cable calibration is longer needed, which greatly reduces the testing effort. Further, the cost of setting up an EMC test chamber goes down, because for example fiber optic cables are no longer needed to be used.

BRIEF DESCRIPTION OF THE DRAWINGS

These and other aspects and advantages of the present invention will become more apparent when studying the following detailed description, in connection with the FIGURE in which:

FIG. 1 shows schematically an EMC test system comprising an EMC test chamber.

DETAILED DESCRIPTION

As already described above, EMC testing is required to confirm that an electrical or electronic device or a system meets the required standards. In particular, EMC testing is necessary to ensure that the electrical or electronic device or system does not emit a large amount of EMI.

Such devices, also called DUT, are positioned for the EMC testing in a corresponding EMC test chamber, which also comprises for example an antenna or other measurement equipment inside the EMC test chamber.

Until now, this measurement equipment is connected to each other and to a measurement computer/measurement processing unit for evaluating, analyzing and displaying the measurement values, via RF cables or fiber optic cables. These cables, however, are expensive and fragile and RF cables for example further need a frequent calibration. Further, such cables are possible sources for emissions/interferences and fiber optic cables should not be bend and should be laid out in a straight line.

In the present invention, however, such RF cables or fiber optic cables are no longer needed. Instead, the communication between the different devices inside such an EMC test chamber is performed by LiFi.

LiFi uses light to transmit data between devices and thus, the communication with LiFi does not generate EMI and therefore, does not disturb the measurement in the EMC test chamber.

FIG. 1 now shows an EMC test system 1 comprising an EMC test chamber 2. Inside the EMC test chamber 2 one or more DUTs 6 that need to be tested regarding EMC are positioned, for example on a wooden table. Further, an antenna 4 for radiated emission measurement is placed inside the EMC test chamber 2.

In addition to the antenna 4 further measurement equipment, not shown in FIG. 1, can is be also placed inside the EMC test chamber 2.

Further, in FIG. 1 a room 8 separate from the EMC test chamber 2 is shown, in which a measurement computer/measurement processing unit 5 is placed that can evaluate and analyze corresponding measurement data/values of the antenna 4. For example, measurement processing unit 5 receives corresponding signals from the antenna 4 and applies a Fast Fourier Transformation (FFT) to display results in the frequency domain on a monitor or a similar device.

According to the present invention, the antenna 4 is now not anymore connected to the measurement processing unit 5 via a RF cable or a fiber optic cable. Instead, for the transmission of data between the antenna 4 and the measurement processing unit 5 LiFi is used. At or in the antenna 4 therefore corresponding communication means 3 are placed that can transmit and/or receive data by using LiFi. For example, the antenna 4 can comprise as LiFi communication means 3 a transmitter, in particular a LED, for transmitting measurement data/values obtained by the antenna 4.

In addition, the EMC test chamber 2 as well as the room 8 of the EMC test system 1 comprise LiFi communication means 3 positioned at the ceilings of the EMC test chamber 2 and the room 8. With the LiFi communication means 3 positioned at the ceiling of the EMC test chamber 2, the LiFi communication means 3 of the antenna 4 can perform a corresponding LiFi communication inside the EMC test chamber 2. The LiFi communication means 3 positioned at the ceiling of the EMC test chamber 2 are then connected to the LiFi communication means 3 placed on the ceiling of the room 8. The LiFi communication means 3 placed on the ceiling of room 8 can then communicate with corresponding LiFi communication means placed at the measurement processing unit 5 by using LiFi.

The LiFi communication means 3 positioned at the ceilings of the EMC test chamber 2 and the room 8 can comprise transmitters and/or receivers, wherein the transmitter can be, for example, an LED and the receiver can be a photodiode or a photovoltaic cell.

The antenna 4 further comprises a shielded converter 7 that is positioned between the antenna 4 and the LiFi communication means 3 of the antenna 4 for converting the RF is signals obtained by the antenna 4 into corresponding LiFi signals. In this regard, also the measurement processing unit 5 can comprise a corresponding converter, which converts the LiFi signals received by the LiFi communication means placed at or in the measurement processing unit 5 to corresponding RF signals.

In addition to the function that the antenna 4 can send the obtained measurement data via LiFi to the corresponding measurement processing unit 5, it is also possible that the LiFi communication means 3 of the antenna 4 can further comprise a receiver, for example a photodiode or a photovoltaic cell, that receives control data from the measurement processing unit 5. The measurement antenna 4 is, for example, adapted to move vertically and/or to change polarization. The movement can be controlled then, for example, by the measurement processing unit 5.

Further, it is also possible that the DUT 6 comprises communication means using LiFi for communicating with the measurement processing unit 5. The LiFi communication means of the DUT 6 can comprise, for example, a receiver that is used for receiving control data for controlling the DUT 6. The DUT 6 could also comprise a transmitter for sending corresponding data to the measurement processing unit 5.

Furthermore, in general, any measurement equipment placed inside the EMC test chamber 2 can be provided with/comprise corresponding communication means that use LiFi for communicating via LiFi with other devices. It is also possible that any measurement equipment comprise a corresponding converter for converting RF signals into LiFi signals or LiFi signals into RF signals.

In this regard, it should be noted that the LiFi communication means 3 placed at the ceilings of the EMC test chamber 2 and the room 8 can also be placed anywhere else in the EMC test chamber 2 and the room 8.

It is also possible that a measurement processing unit is not placed separately, but placed inside the EMC test chamber 2.

Generally, in the present invention, LiFi communication is used instead of RF cables is or fiber optical cables, so that cable calibration is no longer needed and potential emissions via damaged RF cables are eliminated and maintenance of RF cables is also eliminated. Further, no more expensive fiber optical cables have to be used.

The invention claimed is:

1. An electromagnetic compatibility, EMC, test system for testing a device under test, DUT, wherein the EMC test system comprises:
   an EMC test chamber, wherein the DUT is positioned in the EMC test chamber,
   at least one measurement equipment positioned in the EMC test chamber, and
   communication means using light fidelity, LiFi, for transmitting and receiving control data by the measurement equipment,
   wherein the LiFi communication means comprise at least one transmitter and at least one receiver, and
   wherein the receiver of the LiFi communication means is positioned at or in the at least one measurement equipment and is used for receiving control data for controlling the measurement equipment.

2. The EMC test system according to claim 1, wherein the EMC test chamber is an anechoic chamber, a reverberation chamber or a gigahertz transverse electromagnetic, GTEM, cell.

3. The EMC test system according to claim 1, wherein the at least one measurement equipment is a measurement antenna.

4. The EMC test system according to claim 1, wherein the LiFi communication means comprise the at least one transmitter, in particular a LED, and the at least one receiver, in particular a photodiode or a photovoltaic cell.

5. The EMC test system according to claim 4, wherein the measurement data obtained by the at least one measurement equipment are RF signals and the EMC test system further comprises a converter, in particular a shielded converter, in the EMC test chamber positioned between the at least one measurement equipment and the transmitter of the LiFi communication means for converting the RF signals into LiFi signals.

6. The EMC test system according to claim 5, further comprising a measurement processing unit, in particular a computer or a tablet, for evaluating and/or analyzing measurement data and for controlling the at least one measurement equipment and/or the DUT.

7. The EMC test system according to claim 6, wherein the measurement processing unit is positioned in the EMC test chamber and wherein a transmitter and a receiver of the LiFi communication means are positioned at the measurement processing unit and are used for transmitting and receiving measurement data and control data.

8. The EMC test system according to claim 7, wherein the at least one measurement equipment obtains measurement data and transmits the obtained measurement data by using LiFi.

9. The EMC test system according to claim 8, wherein the DUT receives control data for controlling the DUT by using LiFi.

10. The EMC test system according to claim 7, wherein the at least one measurement equipment receives control data for controlling the at least one measurement equipment by using LiFi.

11. The EMC test system according to claim 7, wherein the measurement processing unit transmits and receives measurement data and control data by using LiFi.

12. The EMC test system according to claim 6, wherein the measurement processing unit is positioned outside the EMC test chamber and the measurement processing unit is connected with the at least one transmitter and/or at least one receiver of the LiFi communication means positioned at the celling of the EMC test chamber.

13. The EMC test system according to claim 1, wherein a transmitter of the LiFi communication means is used for transmitting measurement data obtained by the at least one measurement equipment.

14. The EMC test system according to claim 13, wherein at least one transmitter and/or at least one receiver of the LiFi communication means is positioned at a celling of the EMC test chamber.

15. The EMC test system according to claim 1, wherein a receiver of the LiFi communication means is positioned at the DUT and is used for receiving control data for controlling the DUT.

* * * * *